(12) United States Patent
Hsu et al.

(10) Patent No.: US 7,541,298 B2
(45) Date of Patent: Jun. 2, 2009

(54) STI OF A SEMICONDUCTOR DEVICE AND FABRICATION METHOD THEREOF

(75) Inventors: Shao-Ta Hsu, Tai-Nan (TW); Neng-Kuo Chen, Hsin-Chu (TW); Teng-Chun Tsai, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 128 days.

(21) Appl. No.: 11/621,968

(22) Filed: Jan. 10, 2007

(65) Prior Publication Data

US 2008/0166888 A1    Jul. 10, 2008

(51) Int. Cl.
*H01L 21/31* (2006.01)
*H01L 21/469* (2006.01)

(52) U.S. Cl. ............... 438/789; 438/359; 257/E21.548; 257/E29.02; 257/510

(58) Field of Classification Search ................. 438/789, 438/359, 427, 784, 435, 783; 257/510, E21.548, 257/E21.54, E21.546, E29.02
See application file for complete search history.

(56) References Cited

U.S. PATENT DOCUMENTS

| 6,043,136 | A | * | 3/2000 | Jang et al. | 438/424 |
| 6,360,685 | B1 | * | 3/2002 | Xia et al. | 118/723 ME |
| 2006/0029736 | A1 | * | 2/2006 | S. Sandhu et al. | 427/248.1 |
| 2006/0054989 | A1 | * | 3/2006 | Kim et al. | 257/510 |
| 2007/0020875 | A1 | | 1/2007 | Hsu | |

* cited by examiner

*Primary Examiner*—Caridad M Everhart
(74) *Attorney, Agent, or Firm*—Winston Hsu

(57) ABSTRACT

A method for filling silicon oxide materials into a trench includes providing a substrate having a plurality of trenches, performing a first deposition process to form a first silicon oxide layer in the trenches, and performing a second deposition process to form a second silicon oxide layer in the trenches. The reactant gas of the first deposition process has a first $O_3$/TEOS flow ratio larger than a second $O_3$/TEOS flow ratio of the reactant gas of the second deposition process.

21 Claims, 11 Drawing Sheets

STI OF A SEMICONDUCTOR DEVICE AND FABRICATION METHOD THEREOF

BACKGROUND OF THE INVENTION

1. Field of the Invention

The invention relates to a shallow trench isolation (STI) of a semiconductor device and fabrication method thereof, and more particularly, to an STI of a semiconductor material fabricated by a multi-step deposition method with non-TEOS ramp up process.

2. Description of the Prior Art

In semiconductor products, silicon oxide materials and silicon nitride materials are generally used to form isolation structures for isolating electric elements or devices. Conventional oxide dielectric layers or isolation structures are fabricated by localized oxidation isolation (LOCOS) methods or thin film deposition processes. For example, some gases such as silane ($SiH_4$), tetra-ethyl-ortho-silicate (TEOS) and oxygen are used in a thin film deposition process to form a dielectric layer. The chemical reaction between the gases forms a thin film on the semiconductor wafer to provide electrical insulation between devices.

In the fabrication process of semiconductor devices with line width less than 0.18 μm, shallow trench isolations are mainly utilized for being the isolation structures of active areas. The formation of an STI is to form a shallow trench near the surface of a semiconductor substrate and to fill a silicon oxide layer into the shallow trench for electrically isolating adjacent active areas. However, as the critical dimension of the integrated circuit devices shrinks to very deep sub-micron scale or beyond, it becomes more and more critical to completely fill silicon oxide layer into the shallow trenches for forming reliable and effective isolation structure in the art.

Conventional fabrication method of shallow trench isolations includes high density plasma chemical vapor deposition (HDCVD) method, which is utilized to form dielectric materials filling shallow trenches. After the formation of the dielectric materials, a chemical mechanical polishing (CMP) process is performed to remove the dielectric materials above the shallow trenches to leave a plan top surface of the shallow trench. However, conventional CVD methods have no longer provided satisfactory step coverage when dealing with high aspect ratio trenches, such as the trenches with aspect ratios more than 6, which are typically encountered in the fabrication of advanced integrated circuits under 65 nm scale semiconductor fabrication process.

To overcome this, ozone-assisted sub-atmospheric pressure chemical vapor deposition (SACVD) techniques have been developed. The ozone-assisted SACVD utilizes ozone and TEOS as the reactant gas to form conformal silicon oxide layer under a pressure of about 60 torrs. After the SACVD film deposition, a high-temperature nitrogen anneal is performed to densify the deposited SACVD film.

However, the prior art ozone-assisted SACVD techniques have several drawbacks when they are employed in the device isolation field. First, after the high-temperature anneal treatment, the deposited SACVD film is apt to shrink. For example, a shrinkage of about 7% has been observed after annealed at 1050° C. for 30 minutes. Besides, the film quality of the SACVD silicon oxide and its resistance to wet etchant are not high enough. Furthermore, the deposition sensitivity of the SACVD silicon oxide is not low enough.

Another problem encountered when employing SACVD to form trench isolation regions includes seams and voids occurring in the dielectric films in the trenches. Please refer to FIG. 1, which is a sectional schematic diagram of an STI formed by a conventional SACVD process. Since the silicon oxide layer film 12 formed by the SACVD film deposition is conformal and uniform along the sidewalls 16 of the trench 14, a seam defect 18 or a void defect 20 are left near the central line of the trench 14 when the trench 14 is filled up. The seam defect 18 and void defect 20 are concerned because they cannot be removed by mere high-temperature nitrogen anneal as mentioned supra, and because they are subject to corrosion or attacks by the wet etchant used in the subsequent wet cleaning procedures, which affects the performance of the semiconductor elements and causes polysilicon circuit shorts.

Recently, TEOS ramp-up SACVD method is brought up to fabricate a shallow trench isolation for improving the quality of silicon oxide layers formed by the conventional SACVD processes. The TEOS ramp-up SACVD method includes providing a continuous flow of a silicon-containing gas and a flow of an oxidizing processing gas to the reaction chamber to perform a SACVD process, wherein the silicon-containing gas flow rate continuously ramps up when depositing the silicon oxide layer into the trench. The TEOS ramp-up SACVD method may improve the deposition sensitivity of the silicon oxide layer. However, when the width of a trench is less than 65 nanometers or even less than 45 nanometers, the above-mentioned seam defect and void defect problems still occur in the silicon oxide layer formed by the TEOS ramp-up SACVD method.

Therefore, it is desirable to be able to fill narrow gaps with dielectric material in a void-free or a seam-free manner.

SUMMARY OF THE INVENTION

A primary objective of the claimed invention is to provide a multi-step deposition method with non-TEOS ramp up process to fabricate silicon oxide layers for forming an isolation structure of a semiconductor device, which has multi-layer silicon oxide layers near a surface of a substrate.

According to the claimed invention, a method for filling silicon oxide layers into a trench comprises providing a substrate having a plurality of trenches, performing a first deposition process by providing a reactant gas with a first $O_3$/TEOS flow ratio to form a first silicon oxide layer on the surface of the substrate and in the trenches, and performing a second deposition process by providing a reactant gas with a second $O_3$/TEOS flow ratio to form a second silicon oxide layer on the substrate and in at least one of the trenches. The second $O_3$/TEOS flow ratio is less than the first $O_3$/TEOS flow ratio.

Accordingly to the claimed invention, a semiconductor device is further provided. The semiconductor device comprises a substrate, at least a first trench and at least a second trench positioned near a surface of the substrate, wherein the width of the first trench is less than the width of the second trench. The semiconductor conductor further comprises a first silicon oxide layer completely filling the first trench and positioned on surfaces of the bottom and sidewall of the second trench, and a second silicon oxide layer positioned in the second trench, covering the first silicon oxide layer, wherein the carbon concentration of the first silicon oxide layer is different from the carbon concentration of the second silicon oxide layer.

It is an advantage of the claimed invention that the reactant gas with a high $O_3$/TEOS flow ratio is employed to form a first silicon oxide layer so that the first silicon oxide layer have a preferable quality, such as with good gap fill capacity, low deposition sensitivity, and low shrinkage. As a result, the first silicon oxide layer formed in the trench is conformal, which can uniformly and completely fill a trench with a width smaller than 45 nanometers in a void-free manner. In addition, according to the present invention, a reactant gas with a less second $O_3$/TEOS flow ratio is provided to perform the second deposition process after the stop of the first deposition process, which forms the second silicon oxide layer with a higher rate to effectively fill large trenches. Therefore, the claimed invention can give consideration to the quality of STI with different sizes and to the production rate of mass fabrications.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
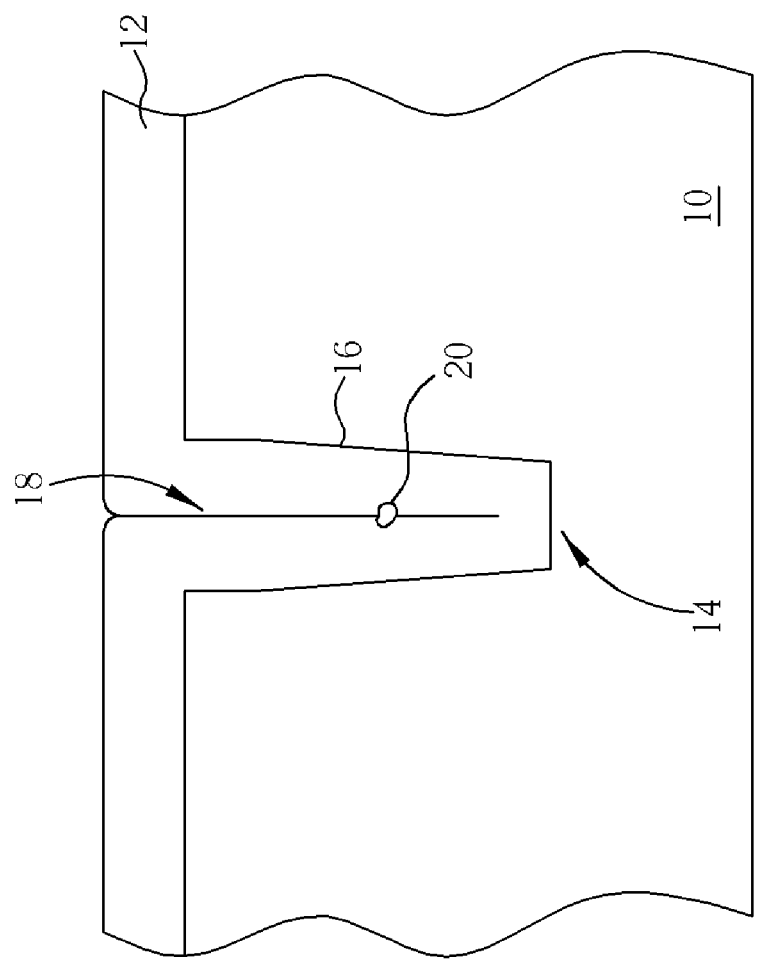
FIG. 1 is a sectional schematic diagram of an STI formed by a conventional SACVD process.
Figure 2:
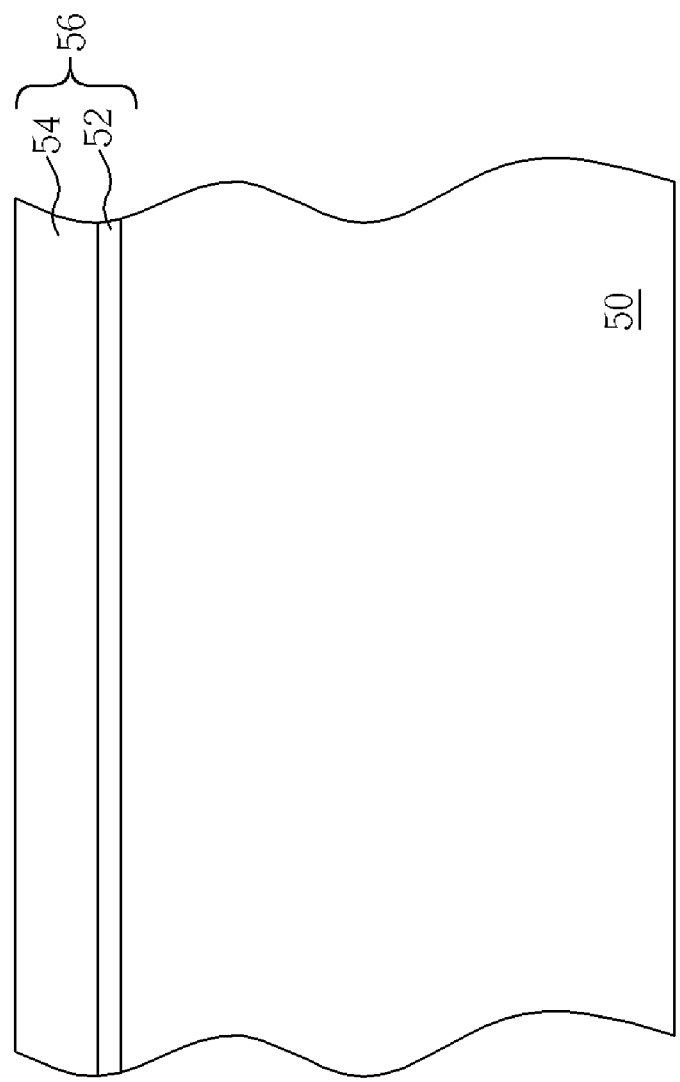
FIGS. 2-6 are sectional schematic diagrams of a fabrication process of an STI according to a first embodiment of the present invention.

Please refer to FIGS. 2-6. FIGS. 2-6 are sectional schematic diagrams of a fabrication process of an STI according to a first embodiment of the present invention. First, a semiconductor substrate 50, such as a silicon substrate, is provided, as shown in FIG. 2. Then, a pad oxide layer 52 is formed on the semiconductor substrate 50 with a thickness of about 30 angstroms to 200 angstroms, wherein the pad oxide layer 52 may be formed by a CVD process or a thermal oxidation process. After the formation of the pad oxide layer 52, a pad nitride layer 54 with a thickness of about 500 angstroms to 2000 angstroms is formed covering the pad oxide layer 52. The pad oxide layer 52 and the pad nitride layer 54 compose a mask layer 56.

Figure 3:
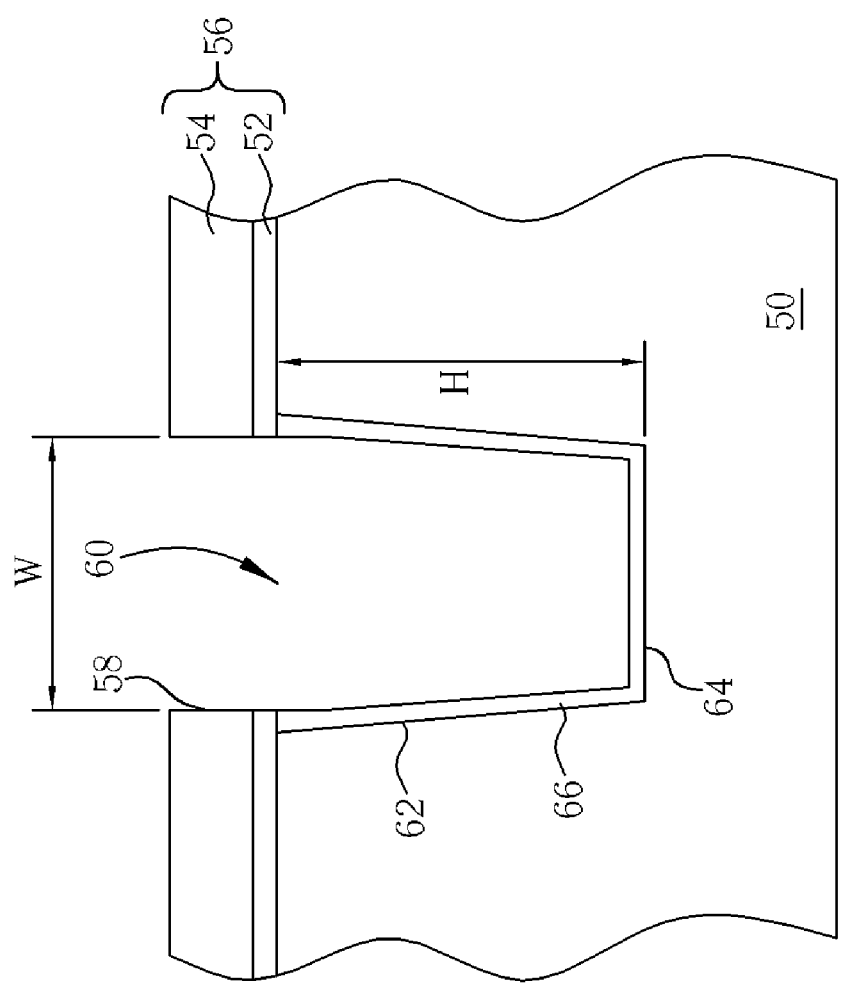

As shown in FIG. 3, a photolithography process and an etching process are sequentially performed to form an opening 58 in the mask layer 56. Then, the mask layer 56 is taken as an etching mask during another etching process to remove a portion of the semiconductor substrate 50 exposed by the opening 58 so as to form a shallow trench 60. The ratio of the height H versus the width W of the shallow trench 60 is defined as an aspect ratio, and the aspect ratio of the shallow trench 60 is more than 4, or even more than 6. A thermal oxidation process is selectively performed to form a liner oxide layer 66 on the surfaces of the sidewall 62 and the bottom 64 of the shallow trench 60.

Figure 4:
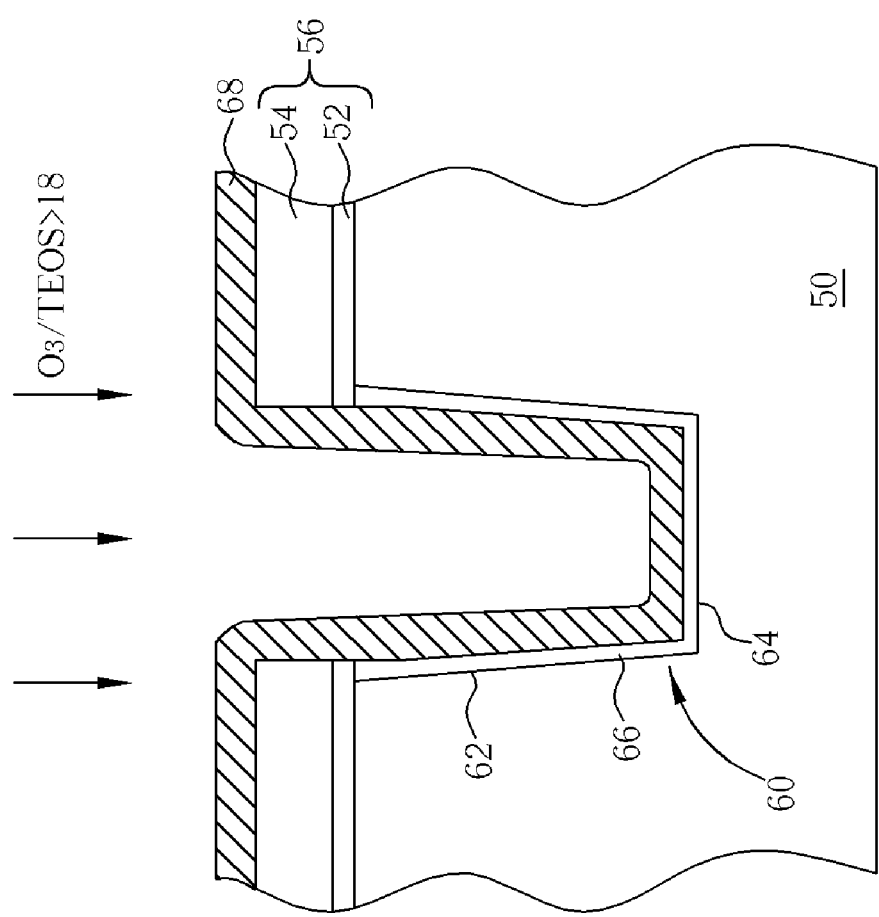

Referring to FIG. 4, a first silicon oxide layer deposition process is performed by providing a reactant gas with an $O_3$/TEOS flow ratio more than 18 to the reaction chamber so that a first silicon oxide layer 68 is formed on the sidewall 62 and the bottom 64 of the shallow trench 60. Since the silicon oxide layer formed by the reactant gas with a $O_3$/TEOS flow ratio more than 18 has a low deposition sensitivity (surface selectivity) and a good gap fill capacity, the first silicon oxide layer 68 is uniformly formed on the sidewall 62 and the bottom 64 of the shallow trench 60.

Figure 5:
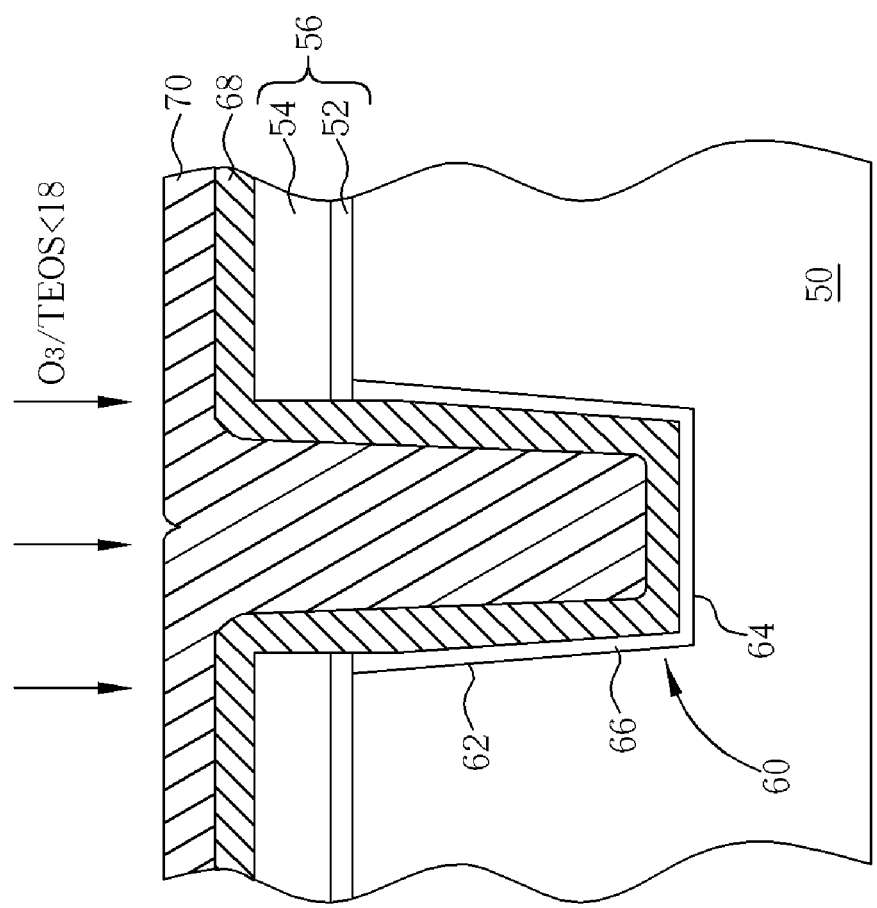

Please refer to FIG. 5. Since the first silicon oxide layer 68 formed by the first silicon oxide layer deposition process overcomes the deposition sensitivity problem, a second silicon oxide layer deposition process is performed by providing a reactant gas with an $O_3$/TEOS flow ratio less than 18. Sequentially, a second silicon oxide layer 70 is formed covering the surface of the first silicon oxide layer 68 and completely filling the inner portion of the shallow trench 60. Then, a steam annealing process is performed by providing high $H_2/O_2$ gas flow under a temperature of about 700° C. After the steam annealing process, the temperature is raised to about 1000° C. to densify the first silicon oxide layer 68 and the second silicon oxide layer 70, as shown in FIG. 5.

Figure 6:
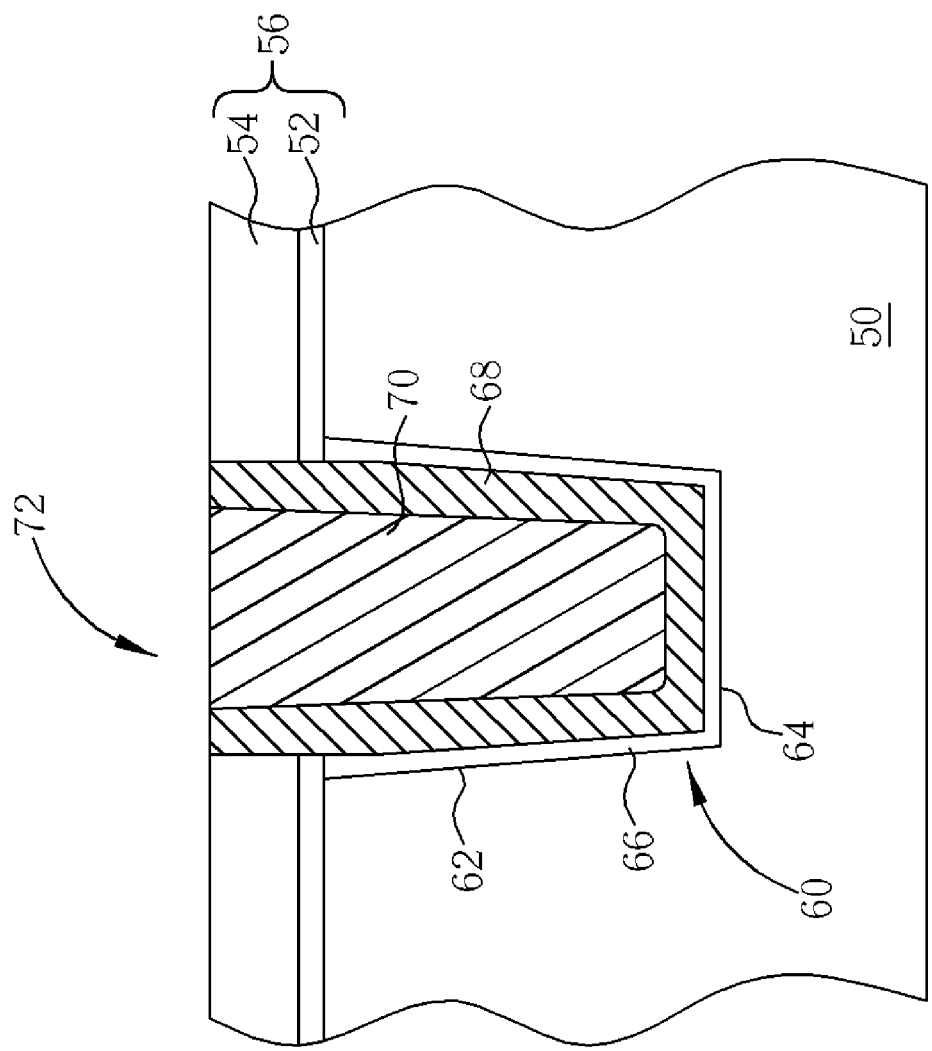

Referring to FIG. 6, a chemical mechanical polishing (CMP) process is then performed by taking the pad nitride layer 54 as a stop layer to remove the first silicon oxide layer 68 and the second silicon oxide layer 70 above the surface of the semiconductor substrate 50 so that a sallow trench isolation 72 is fabricated.

In a semiconductor wafer, sallow trench isolations for electrically isolating elements may have different sizes and aspect ratios according to the design of electric circuits. For shallow trenches with various aspect ratios, each deposition process may produce silicon oxide layers with various gap filling performances. Therefore, a second embodiment of the present invention would introduce the method of forming silicon oxide layers into a plurality of shallow trenches with different aspect ratios at the same time for fabricating shallow trench isolations in a single semiconductor wafer with good performance.

Figure 7:
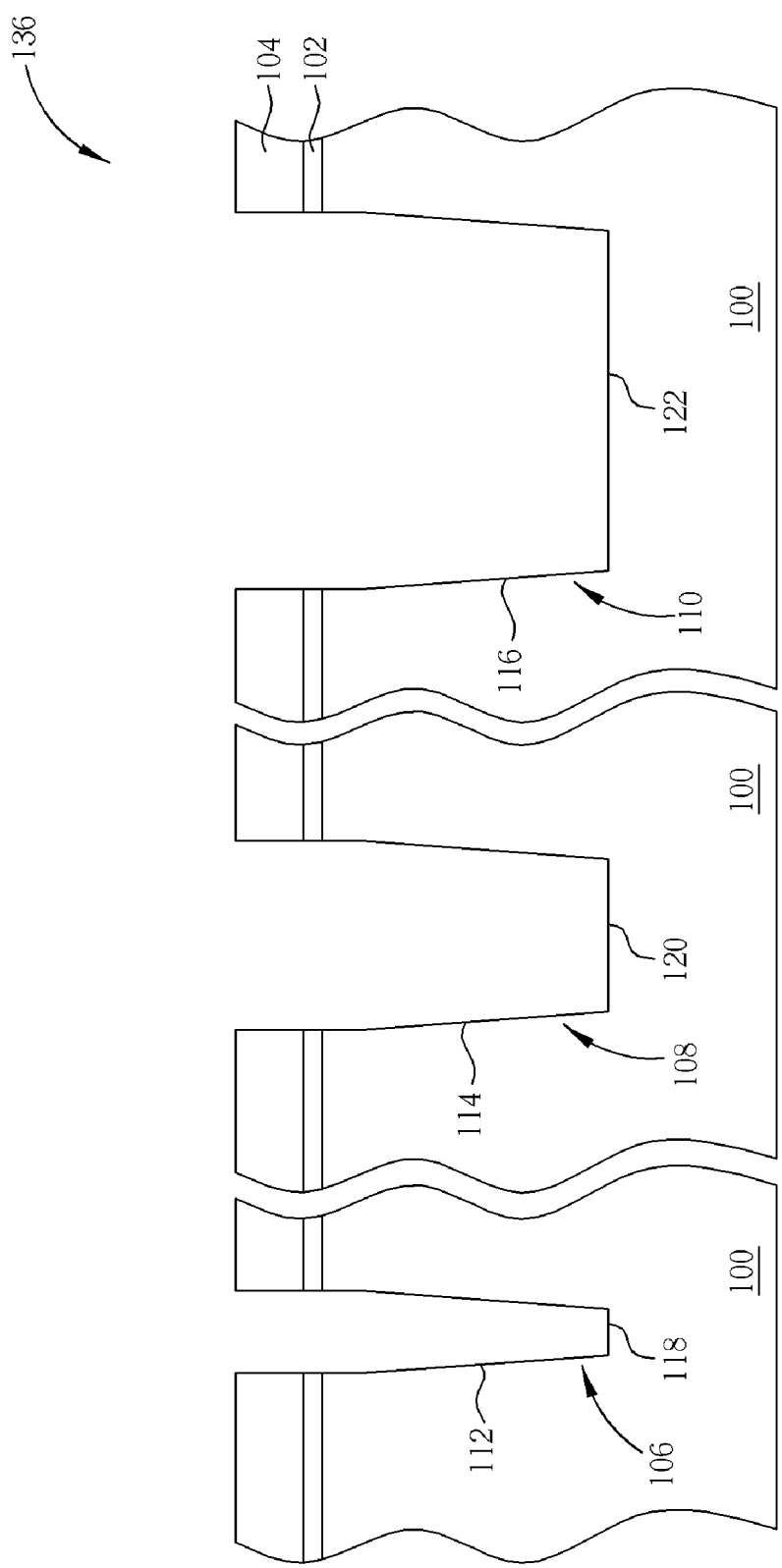
FIGS. 7-11 are sectional schematic diagrams of fabrication process of STIs of a semiconductor device according to a second embodiment of the present invention.

Please refer to FIGS. 7-11. FIGS. 7-11 are sectional schematic diagrams of fabrication process of a semiconductor device 136 according to a second embodiment of the present invention. Referring to FIG. 7, the semiconductor device 136 comprises a semiconductor substrate 100. A pad oxide layer 102, a pad nitride layer 104, and electrical elements (not shown) are positioned on the surface of the semiconductor substrate 100. A photolithography-etching process is performed to form a plurality of shallow trenches on the surface of the semiconductor substrate 100, wherein these shallow trenches comprises at least three different widths. As shown in FIG. 7, the width of the first shallow trench 106 is smaller than the width of the second shallow trench 108, and the width of the second shallow trench 108 is smaller than that of the third shallow trench 110. For example, the width of the first shallow trench 106 is about 45 nanometers, the width of the second shallow trench 108 is about 65 nanometers, and the width of the third shallow trench 110 is about 85 nanometers. Accordingly, the aspect ratio of the first shallow trench 106 is more than that of the second shallow trench 108, and the aspect ratio of the second shallow trench 108 is more than the aspect ratio of the third shallow trench 110.

Figure 8:
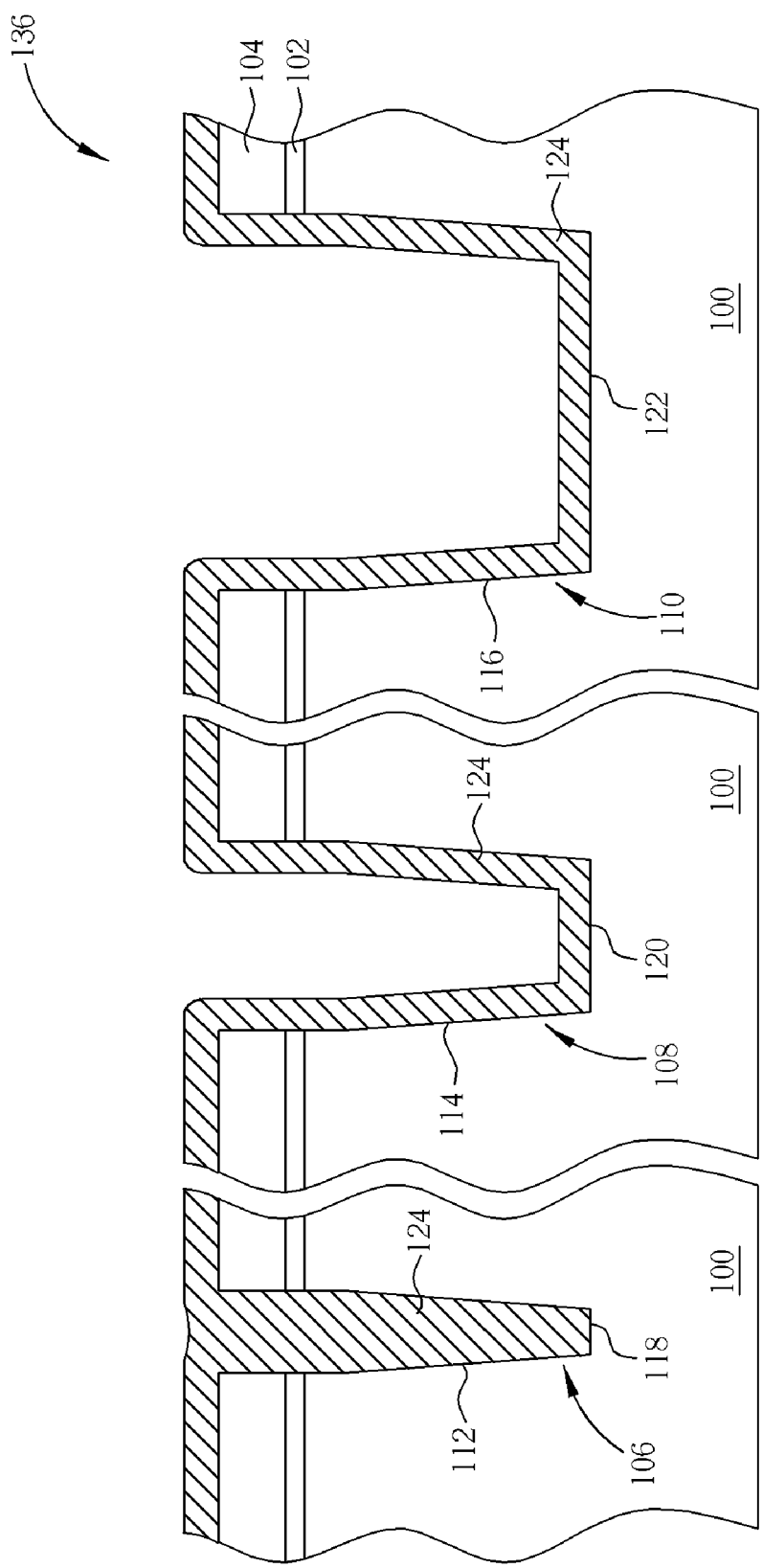

Referring to FIG. 8, a thermal oxidation process is selectively performed to form a thermal oxide layer (not shown) on the inner surfaces of the first shallow trench 106, the second shallow trench 108, and the third shallow trench 110 respectively. Then, a reactant gas with a first $O_3$/TEOS flow ratio is provided to the reaction chamber to perform a first silicon oxide layer SACVD process to form a first silicon oxide layer 124 on the semiconductor substrate 100 and in the first shallow trench 106, the second shallow trench 108, and the third shallow trench 110.

It should be noted that the silicon oxide layer will have a better quality, such as better gap fill capacity, low deposition sensitivity, and low shrinkage, when it is formed through a SACVD process with the reactant gas having higher $O_3$/TEOS flow ratio. On the other hand, the first shallow trench 106 with the highest aspect ratio is the hardest trench to be completely and perfectly filled with the silicon oxide layer. Therefore, the first silicon oxide layer deposition process will not be stopped before the narrowest first shallow trench 106 is completely filled with the first silicon oxide layer 124. In other words, the first silicon oxide layer deposition process can be stopped when the thickness of the first silicon oxide layer 124 reaches about a half of the width of the first shallow trench 106. In this embodiment, the process time of the first silicon oxide layer deposition process is about more than 160 seconds, and the thickness of the first silicon oxide layer 124 is about 200 angstroms. At this time, the first trench sidewall 112, the first trench bottom 118, and the inner portion of the first shallow trench 106 are completely filled with the first silicon oxide layer 124 without any voids or seams. On the other hand, on the surfaces of the second trench sidewall 114, the second trench sidewall bottom 120, the third trench sidewall 116, and the third trench bottom 122 are the conformal first silicon oxide layer 124. In addition, since the TEOS concentration is low in the reactant gas, the carbon concentration of the first silicon oxide layer 124 is low.

Figure 9:
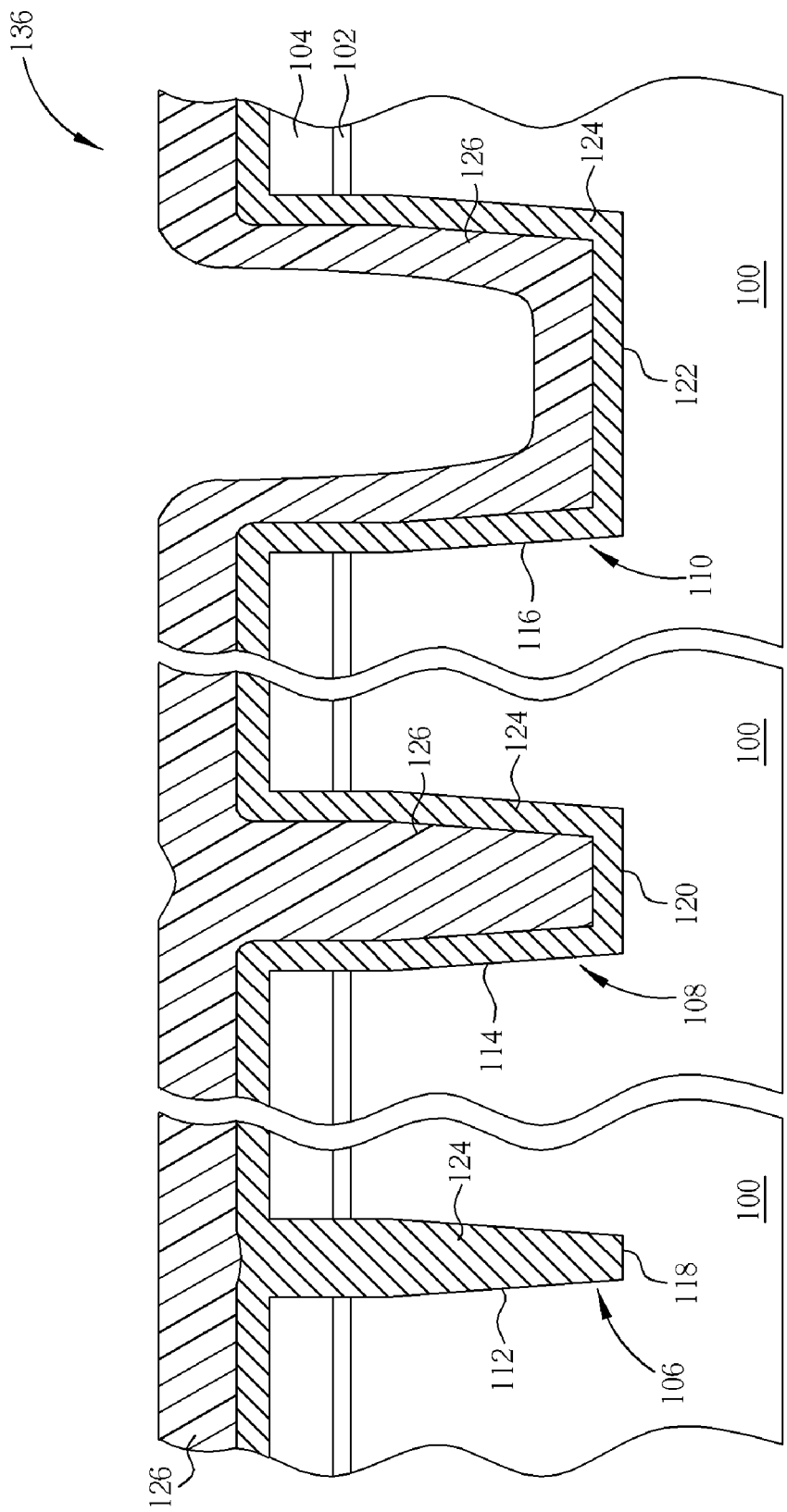

Please refer to FIG. 9. A second silicon oxide layer deposition process with SACVD method is performed through providing a reactant gas with a second $O_3$/TEOS flow ratio, wherein the second $O_3$/TEOS flow ratio is less than 18. The second silicon oxide layer deposition process is continued about 300 seconds. A second silicon oxide layer 126 is formed on the overall surface of the semiconductor substrate 100, wherein the second silicon oxide layer 126 completely fills the portion of the second shallow trench 108 that is not occupied by the first silicon oxide layer 124 and covers the first silicon oxide layer 124 on the surfaces of the third trench bottom 122 and the third trench sidewall 116.

Figure 10:
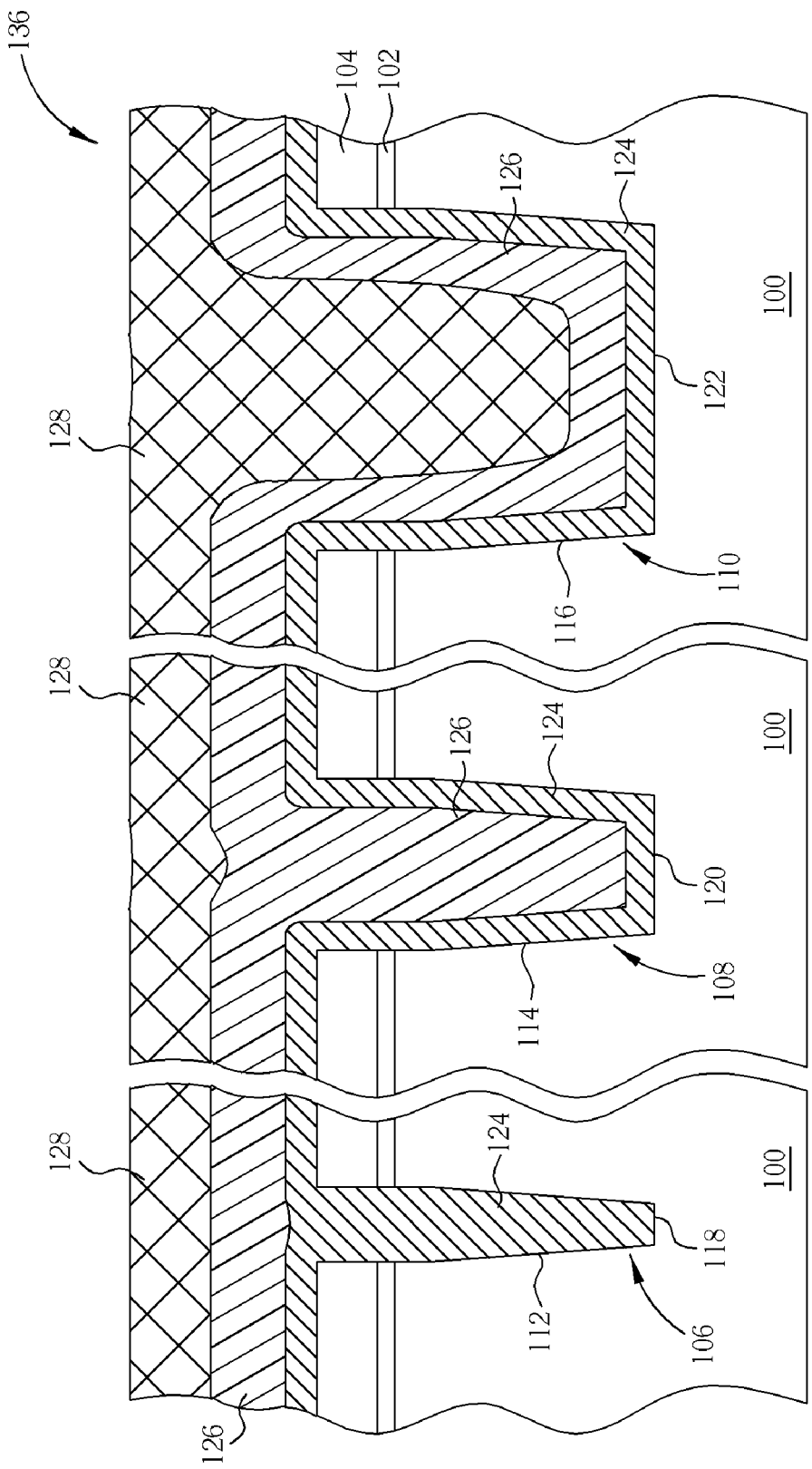

Then, as shown in FIG. 10, a third silicon oxide layer deposition process is performed to provide a reactant gas with a third $O_3$/TEOS flow ratio to the reaction chamber to form a third silicon oxide layer 128 on the overall surface of the semiconductor substrate 100, covering the second silicon oxide layer 124, wherein the third silicon oxide layer deposition process is also a SACVD process. The third silicon oxide layer 128 completely fills the portion of the third shallow trench 110 that is not occupied by the first silicon oxide layer 124 and the second silicon oxide layer 126. The third $O_3$/TEOS flow ratio is less than the second $O_3$/TEOS flow ratio. Accordingly, the carbon concentration of the third silicon oxide layer 128 is more than the carbon concentrations of the first silicon oxide layer 124 and the second silicon oxide layer 126. Furthermore, the shrinkage of the third silicon oxide layer 128 is more than both the shrinkages of the first silicon oxide layer 124 and the second silicon oxide layer 126.

Then, a steam annealing process is performed through providing high oxygen and hydrogen flows under a temperature of about 700° C. After the steam annealing process, the temperature is raised to about 1000° C. to perform a densification process to the first silicon oxide layer 124, the second silicon oxide layer 126, and the third silicon oxide layer 128.

It should be noted that the SACVD of the third silicon oxide layer deposition process can be replaced by other deposition processes, such as a high density plasma chemical vapor deposition (HDPCVD), to form the third silicon oxide layer 128 because the width of the third shallow trench 110 is large enough so that it is easy to completely fill the third shallow trench 110.

Figure 11:
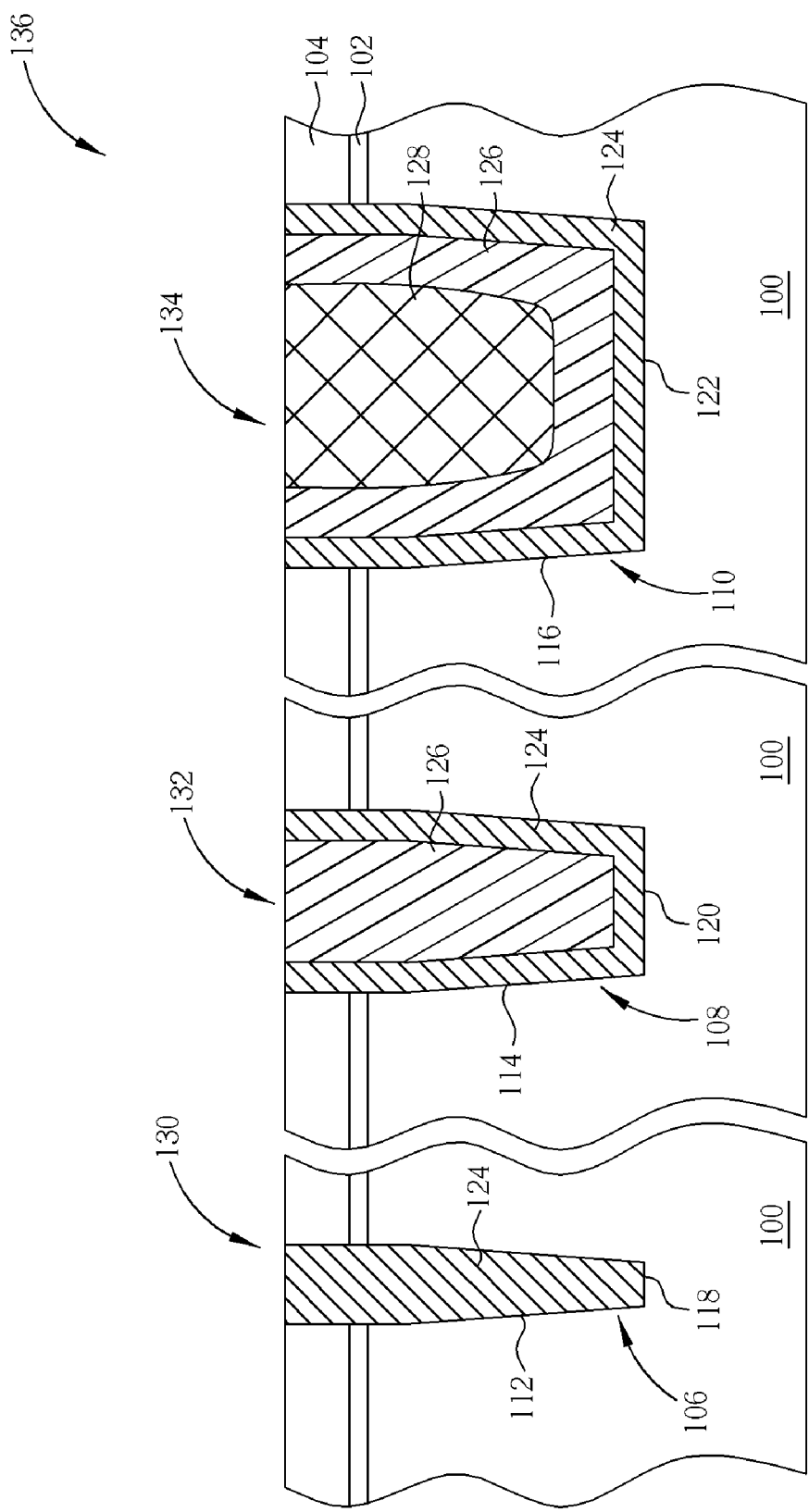

Please refer to FIG. 11. Finally, a planarization process, such as a CMP process, is performed to remove the first silicon oxide layer 124, the second silicon oxide layer 126, and the third silicon oxide layer 128 above the pad nitride layer 104 on the semiconductor substrate 100 so as to finish the formation of the first STI 130, the second STI 132, the third STI 134 with different sizes. As shown in FIG. 11, in the first STI 130 with the smallest width only has the first silicon oxide layer 124 with one carbon concentration. The second STI 132 has two different carbon concentrations for that the STI 132 contains two silicon oxide layers, the first silicon oxide layer 124 and the second silicon oxide layer 126, wherein the second silicon oxide layer 126 positioned in the central part of the second STI 132 has a higher carbon concentration than that of the first silicon oxide layer 124. Furthermore, there are the first silicon oxide layer 124 with a lowest carbon concentration, the second silicon oxide layer 126, and the third silicon oxide layer 128 with a highest carbon concentration positioned inside the third STI 134 from the surfaces of the third trench bottom 122 and the third trench sidewall 116 to the central part of the third STI 134. Therefore, the third STI 134 comprises three various carbon concentrations of its silicon oxide layers.

The main spirit of the present invention is that a multi-step SACVD process with various $O_3$/TEOS flow ratio in each SACVD step is provided according to that the silicon oxide layer will have a good quality when the reactant gas has a high $O_3$/TEOS flow ratio. Therefore, the reactant gas with a highest $O_3$/TEOS flow ratio is first performed to form a first silicon oxide layer with a low carbon concentration for completely fill the trench with a highest aspect ratio before a second or more deposition processes with less $O_3$/TEOS flow ratio are performed. It should be noted that each of the silicon oxide layer deposition processes employed a reactant gas with a fixed $O_3$/TEOS flow ratio, so that the formed silicon oxide layer through each of the silicon oxide layer has its own constant carbon concentration. In addition, since the $O_3$/TEOS flow ratio of each silicon oxide layer deposition process is smaller than the previous deposition process, the later formed silicon oxide layer has a higher carbon concentration than previous formed one, as described in the second embodiment of the present invention. As a result, the STI formed according to the present invention has multi-layer silicon oxide layers with various carbon concentrations and shrinkages.

Please refer to Table I, which describes the qualities of the silicon oxide layers fabricated by SACVD processes with different $O_3$/TEOS flow ratio. The process A utilize a reactant gas with a $O_3$/TEOS flow ratio higher than that of the process B, and the $O_3$/TEOS flow ratio of the reactant gas of the process B is higher than that of the process C. As shown in Table I, the silicon oxide layer fabricated through the process A has a best quality because it has a low shrinkage and a low wet etch rate ratio (WERR) to a thermal oxide layer. On the contrary, the silicon oxide layer formed through a reactant gas with the lowest $O_3$/TEOS flow ratio in the process C has a bad quality since it has a high shrinkage and a high WERR.

TABLE I

| Oxide layer quality | Process A | Process B | Process C |
|---|---|---|---|
| Shrinkage (%) | 1.50% | 3% | 5% |
| WERR | 1.16 | 1.16 | 1.32 |
| Deposition rate (Å/min) | 250 | 423 | 166 |

Please refer to Table II. Table II is a comparison table of the deposition sensitivity of the silicon oxide layers formed with different $O_3$/TEOS flow ratios. Table II tells that the silicon oxide layer formed through a reactant gas with a $O_3$/TEOS flow ratio more than 18 has a comparatively good quality because it has more similar deposition sensitivities to Si, SiN, SiON, and $SiO_2$ materials than that of the silicon oxide layer formed through a reactant gas with a $O_3$/TEOS flow ratio less than 18.

TABLE II

| | | |
|---|---|---|
| $O_3$/TEOS flow ratio | >18 | <18 |
| $SiO_2$/Si deposition sensitivity | 0.84 | 0.55 |
| $SiO_2$/SiN deposition sensitivity | 0.92 | 0.60 |
| $SiO_2$/SiON deposition sensitivity | 1.00 | 1.08 |

From the above description, performing an SACVD process with the reactant gas having a $O_3$/TEOS flow ratio more than 18 to form a first bottom silicon oxide layer in the beginning of the formation of the STI with a width less than 65 nanometers or even less than 45 nanometers can overcome problems such as the deposition sensitivity, or completely and perfectly fill the smallest shallow trenches in a void-free manner. After that, a second silicon oxide layer deposition process is performed by providing a reactant gas with a less and fixed $O_3$/TEOS flow ratio to deposit a second silicon oxide layer into the shallow trench with larger sizes through a fast rate. In another word, a multi-step SACVD process with non-TEOS ramp up is provided according to the present invention, wherein the first silicon oxide layer formed by the first step of the SACVD process has a low shrinkage and overcomes void and seam defect problems occurring in the prior art. Accordingly, STIs with different sizes and good isolation properties can be fabricated at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of filling silicon oxide layers into trenches comprising:
    providing a substrate having a plurality of trenches;
    performing a first deposition process by providing a reactant gas with a first ozone ($O_3$)/tetra-ethyl-ortho-silicate (TEOS) flow ratio to form a first silicon oxide layer on a surface of the substrate and in the trenches, wherein the first deposition process is stopped after the smallest trench of the trenches is completely filled with the first silicon oxide layer; and
    performing a second deposition process by providing a reactant gas with a second $O_3$/TEOS flow ratio to form a second silicon oxide layer above the first silcon oxide layer, the second $O_3$/TEOS flow ratio being less than the first $O_3$/TEOS flow ratio.

2. The method of claim 1, wherein the first $O_3$/TEOS flow ratio is more than about 18.

3. The method of claim 1, wherein the second $O_3$/TEOS flow ratio is less than about 18.

4. The method of claim 1, wherein the method further comprises performing a third deposition process by providing a reactant gas with a third $O_3$/TEOS flow ratio to form a third silicon oxide layer covering the second silicon oxide layer, the third $O_3$/TEOS flow ratio is less than the second $O_3$/TEOS flow ratio.

5. The method of claim 1, wherein the method further comprises performing a high density plasma chemical vapor deposition (HDPCVD) process to from a third silicon oxide layer on the second silicon oxide layer.

6. The method of claim 1, wherein the method further comprises performing a steam annealing process after the second deposition process.

7. The method of claim 1, wherein the first deposition process comprises a sub-atmospheric chemical vapor phase deposition (SACVD) process.

8. The method of claim 1, wherein the second deposition process comprises a SACVD process.

9. A method for fabricating a shallow trench isolation (STI), the method comprising:
    providing a substrate having a first trench and a second trench, a width of the first trench being less than a width of second trench;
    performing a first deposition process to form a first silicon oxide layer in the first and second trenches so that the first trench is completely filled with the first silicon oxide layer and the bottom and the sidewall of the second trench is covered by the first silicon oxide layer; and
    performing a second deposition process to form a second silicon oxide layer filling into the second trench and covering the first silicon oxide layer, the carbon concentration of the second silicon oxide layer is different from the carbon concentration of the first silicon oxide layer.

10. The method of claim 9, wherein the carbon concentration of the first silicon oxide layer is less than the carbon concentration of the second silicon oxide layer.

11. The method of claim 9, wherein a portion of the second trench that is not occupied by the first silicon oxide layer is completely filled with the second silicon oxide layer.

12. The method of claim 9, wherein the method further comprises performing a chemical mechanical polishing (CMP) process to remove the first silicon oxide layer and the second silicon oxide layer positioned above a surface of the substrate.

13. The method of claim 9, wherein the first deposition process is performed by providing a reactant gas with a $O_3$/TEOS flow ratio more than about 18 to form the first silicon oxide layer.

14. The method of claim 9, wherein the second deposition process is performed by providing a reactant gas with a $O_3$/TEOS flow ratio less than about 18 to form the second silicon oxide layer.

15. The method of claim 9, wherein the method further comprises performing a third deposition process to form a third silicon oxide layer covering the second silicon oxide layer to completely fill a portion of the second trench that is not occupied by the first silicon oxide layer and the second silicon oxide layer.

16. The method of claim 15, wherein the carbon concentration of the third silicon oxide layer is more than the carbon concentration of the second silicon oxide layer.

17. A semiconductor device, comprising:
    a semiconductor substrate;
    at least a first trench and a second trench positioned near a surface of the semiconductor substrate, a width of the first trench is smaller than a width of the second trench;
    a first silicon oxide layer completely filling the first trench and positioned on the surfaces of the bottom and the sidewall of the second trench; and
    a second silicon oxide layer positioned in the second trench and covering the first silicon oxide layer, the carbon concentration of the first silicon oxide layer is different from the carbon concentration of the second silicon oxide layer.

18. The semiconductor device of claim 17, wherein the carbon concentration of the first silicon oxide layer is less than the carbon concentration of the second silicon oxide layer.

19. The semiconductor device of claim 17, wherein the semiconductor device further comprises a third silicon oxide layer completely filling the portion of the second trench that is not occupied by the first silicon oxide layer and the second silicon oxide layer.

20. The semiconductor device of claim 17, wherein a portion of the second trench that is not occupied by the first silicon oxide layer is completely filled with the second silicon oxide layer, and the semiconductor device further comprises at least a third trench having a width larger than the width of the second trench, the third trench is completely filled with the first silicon oxide layer, the second silicon oxide layer, and a third silicon oxide layer from the surfaces of the bottom and sidewall of the third silicon oxide layer to the central part of the third trench in sequence.

21. The semiconductor device of claim 20, wherein the carbon concentration of the third silicon oxide layer is more than the carbon concentration of the second silicon oxide layer.

* * * * *